(12) United States Patent
Liu et al.

(10) Patent No.: US 7,402,496 B2
(45) Date of Patent: Jul. 22, 2008

(54) COMPLEMENTARY METAL-OXIDE-SEMICONDUCTOR DEVICE AND FABRICATING METHOD THEREOF

(75) Inventors: Che-Hung Liu, Tainan County (TW); Po-Lun Cheng, Kaohsiung County (TW); Chun-An Lin, Chiayi County (TW); Li-Yuen Tang, Hsinchu County (TW); Hung-Lin Shih, Hsinchu (TW); Ming-Chi Fan, Hsinchu (TW); Hsien-Liang Meng, Hsinchu (TW); Jih-Shun Chiang, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 54 days.

(21) Appl. No.: 11/530,480

(22) Filed: Sep. 11, 2006

(65) Prior Publication Data

US 2008/0061366 A1    Mar. 13, 2008

(51) Int. Cl.
*H01L 21/336* (2006.01)
(52) U.S. Cl. ............... 438/300; 438/196; 438/197; 257/66; 257/67; 257/E21.633; 257/E21.663
(58) Field of Classification Search .............. 438/196, 438/197, 300
See application file for complete search history.

(56) References Cited

U.S. PATENT DOCUMENTS

| 6,573,172 | B1 | 6/2003 | En et al. |
| 6,858,506 | B2 | 2/2005 | Chang |
| 7,112,495 | B2 * | 9/2006 | Ko et al. ............... 438/300 |
| 7,176,522 | B2 * | 2/2007 | Cheng et al. ............ 257/338 |

* cited by examiner

*Primary Examiner*—Dao H Nguyen
(74) *Attorney, Agent, or Firm*—Jianq Chyun IP Office

(57) ABSTRACT

A complementary metal-oxide-semiconductor (CMOS) device includes a substrate with a first active region and a second active region; a first gate structure and a second gate structure, respectively disposed on the first active region and the second active region; a first spacer structure and a second spacer structure respectively disposed on sidewalls of the first gate structure and the second gate structure; a first LDD and a second LDD respectively disposed in the substrate at both sides of the first gate structure and the second gate structure; an epitaxial material layer, disposed in the first active region and located on a side of the first LDD; and a passivation layer, disposed on the first gate structure, the first spacer structure, and the first LDD and covering the second active region, wherein the passivation layer comprises a carbon-containing oxynitride layer.

23 Claims, 12 Drawing Sheets

COMPLEMENTARY METAL-OXIDE-SEMICONDUCTOR DEVICE AND FABRICATING METHOD THEREOF

BACKGROUND OF THE INVENTION

1. Field of the Invention

The present invention relates to a semiconductor device and a forming method thereof, in particular, to a complementary metal-oxide-semiconductor device and a fabrication method thereof.

2. Description of Related Art

At present, a method of fabricating a source/drain (S/D) region of a complementary metal-oxide-semiconductor (MOS) transistor using a SiGe technique has been proposed to increase mobility of electrons and holes for improving the performance of devices.

Generally, the method applying the SiGe technique to manufacturing a complementary metal-oxide semiconductor (CMOS) device comprises steps of forming a P-type gate structure and an N-type gate structure on the substrate and then forming a spacer and a lightly-doped drain (LDD) sequentially. Thereafter, a high-temperature oxide (HTO) layer is formed on the entire substrate. After that, a portion of HTO layer on the PMOS transistor region is removed by using a patterned photoresist layer as a mask, so as to expose a surface of the substrate where the S/D region of the PMOS transistor region will be subsequently formed. Meanwhile, a portion of the HTO layer remains on the P-type gate structure and the spacer which is located on the sidewall of the P-type gate structure so as to achieve the function for protecting the gate structure and the spacer. Next, the patterned photoresist layer is removed. Subsequently, the exposed substrate is removed to form a trench. Finally, a SiGe layer is formed in the trench to serve as the S/D region of the PMOS transistor.

However, in the steps of removing the patterned photoresist layer, forming the trench in the PMOS transistor region, and the step of a pre-clean process or a pre-bake process to be performed, the portion of the HTO layer on the P-type gate structure is remove and even a portion of the HTO layer on the IQMOS transistor region is removed to expose the surface of the P-type gate structure and a portion of the substrate surface of the NMOS transistor region. Therefore, when a SiGe process is performed to form the SiGe layer filling in the trench, the SiGe layer is also formed on the exposed substrate surface and the top of the P-type gate structure, i.e., a so-called "poly bump", which seriously affects reliability and performance of devices.

Some US patents also disclose the aforementioned relevant technologies, such as U.S. Pat. No. 6,573,172B1 and U.S. Pat. No. 6,858,506B2. The aforementioned documents are both reference materials of the present invention.

SUMMARY OF THE INVENTION

Accordingly, the object of the present invention is to provide a method of fabricating a complementary metal-oxide-semiconductor device in which the possibility of generation of poly bump, as described in the prior art and other problems derived there-from, may be reduced, and thereby reliability and device performance may be effectively promoted.

Another object of the present invention is also to provide a method of fabricating a complementary metal-oxide-semiconductor device to reduce the possibility of generation of poly bump, as described in the prior art and other problems derived there-from, and thereby promote reliability and performance of devices.

Still another object of the present invention is to provide a complementary metal-oxide-semiconductor device with improved reliability and performance of devices.

Yet another object of the present invention is to provide a complementary metal-oxide-semiconductor device with improved reliability and performance of devices.

According to an embodiment of the present invention, first a substrate comprising an isolation structure is provided and the isolation structure divides the substrate into a first active region and a second active region, wherein the first active region has a first gate structure, a first spacer structure and a first LDD formed therein and the second active region has a second gate structure, a second spacer structure and a second LDD formed therein. Next, a passivation layer is conformally formed over the substrate, wherein the passivation layer is a carbon-containing oxidenitride. Next, a photoresist layer is formed on the passivation layer of the second active region. Next, an etching process is performed by using the photoresist layer as a mask to remain a portion of the passivation layer on the first gate structure and the first spacer structure, and then the photoresist layer is removed. Next, a portion of the exposed substrate in the first active region is removed by using the passivation layer as a mask to form a trench in the substrate. Next, an epitaxial material layer is filled in the trench to serve as a first conductive S/D region, and the passivation layer is removed. Finally, a doped region is formed in the substrate in the second active region to serve as a second conductive S/D region.

According to one embodiment of the present invention, the carbon-containing oxynitride layer includes a bis(tert-butylamino)silane (BTBAS) oxide layer. The method for forming the bis(tert-butylamino)silane oxide layer comprises a low-pressure chemical-vapor deposition.

According to one embodiment of the present invention, after the trench is formed, the method further comprises a step of performing a clean process.

According to one embodiment of the present invention, before the clean process is performed and after the passivation layer is formed, the method further comprises a step of performing a thermal process on the passivation layer. The thermal process is performed at a temperature of about 750~800° C. The thermal process is performed for about 30 seconds to 10 minutes. The thermal process is performed at a pressure of about 5~50 torr. Furthermore, a gas used in the thermal process is selected from a group consisting of helium, neon, argon, krypton, xenon and nitrogen.

According to one embodiment of the present invention, after the doped region is formed, the method further comprises forming a stress layer in the second active region over the substrate, wherein the stress layer conformally covers the second gate structure, the second spacer structure and the doped region. The first conductive S/D region is a P-type S/D region and the epitaxial material layer is a SiGe layer and the stress layer is a tensile stress layer.

According to the embodiment of the present invention, the first conductive S/D region is an N-type S/D region and the epitaxial material layer is a SiGe layer and the stress layer is a compressive stress layer.

The present invention further provides another method of fabricating the complementary metal-oxide-semiconductor device. First, a substrate comprising an isolation structure is provided and the isolation structure divides the substrate into a first active region and a second active region, wherein the first active region has a first gate structure, a first spacer structure and a first LDD formed therein and the second active region has a second gate structure, a second spacer structure and a second LDD formed therein. Next, a first passivation layer is conformally formed over the substrate, wherein the first passivation layer is a carbon-containing oxynitride. Next, a first photoresist layer is formed on the substrate to cover the first passivation layer on the second active layer. Next, an etching process is performed by using the first photoresist layer as a mask to remain a portion of the first passivation layer on the first gate structure and the first spacer structure, and then the first photoresist layer is moved. Next, a portion of the exposed substrate in the first active region is removed by using the first passivation layer as a mask to form a first trench in the substrate. Next, a first epitaxial material layer is filled in the first trench to serve as a first conductive S/D region, and the first passivation layer is removed. Next, a second passivation layer is conformally formed over the substrate, wherein the second passivation layer is a carbon-containing oxynitride layer. Then, a second photoresist layer is formed on the substrate to cover the second passivation layer in the first active region. Next, an etching process is performed by using the second photoresist layer as a mask to remain a portion of the second passivation layer on the second gate structure and the second spacer structure, and the second photoresist layer is removed. Then, a portion of the exposed substrate in the second active region is removed by using the second passivation layer as a mask to form a second trench in the substrate. Finally, a second epitaxial material layer is filled in the first trench to function as a second conductive S/D region.

According to one embodiment of the present invention, the carbon-containing oxynitride layer includes a bis(tert-butylamino)silane (BTBAS) oxide layer. The method for forming the bis(tert-butylamino)silane oxide layer comprises a low-pressure chemical-vapor deposition.

According to one embodiment of the present invention, after the first trench is formed and/or the second trench is formed, the method further comprises a step of performing a clean process.

According to one embodiment of the presept invention, before the clean process is performed and after the first passivation layer and the passivation layer are formed, the method further comprises a step of performing a thermal process on the first passivation layer and the second passivation layer. The thermal process is performed at a temperature of about 750~800° C. The thermal process is performed for about 30 seconds to 10 minutes. The thermal process is performed at a pressure of about 5~50 torr. Furthermore, a gas used in the thermal process is selected from a group consisting of helium, neon, argon, krypton, xenon and nitrogen.

According to one embodiment of the present invention, the first conductive S/D region is a P-type S/D region and the second conductive S/D region is an N-type S/D region. The first epitaxial material layer is a SiGe layer and the second epitaxial material layer is a SiC layer.

According to one embodiment of the present invention, the first conductive S/D region is an N-type S/D region and the second conductive S/D region is a P-type S/D region. The first epitaxial material layer is a SiC layer and the second epitaxial material layer is a SiGe layer.

The present invention further provides the complementary metal-oxide-semiconductor device, which comprises a substrate, a first gate structure, a second gate structure, a first spacer structure, a second spacer structure, a first LDD, a second LDD, an epitaxial material layer, and a passivation layer. A first active region and a second active region are formed on the substrate and separated by an isolation structure. The first gate structure is disposed on the substrate in the first active region, and the second gate structure is disposed on the substrate in the second active region. The first spacer structure is disposed on a sidewall of the first gate structure, and the second spacer structure is disposed on a sidewall of the second gate structure. Additionally, the first LDD is formed in the substrate at both sides of the first gate structure. The second LDD is formed in the substrate at both sides of the second gate structure. The epitaxial material layer is disposed in the substrate in the first active region and located at a side of the first LDD to function as a first conductive S/D region. The passivation is disposed on the first gate structure, the first spacer structure, and the first LDD, and covers the second active region, wherein the passivation layer comprises a carbon-containing oxynitride layer.

According to one embodiment of the present invention, the first conductive S/D region is a P-type S/D region and the epitaxial material layer is a SiGe layer.

According to one embodiment of the present invention, the first conductive S/D region is an N-type S/D region and the epitaxial material layer is a SiC layer.

According to one embodiment of the present invention, the carbon-containing oxynitride layer comprises, for example, a BTBAS oxide layer.

The present invention further provides the complementary metal-oxide-semiconductor device, which comprises a substrate, a first gate structure, a second gate structure, a first spacer structure, a second spacer structure, a first LDD, a second LDD, an first epitaxial material layer, a second epitaxial material layer, and a passivation layer, wherein a first active region and a second active region are formed on the substrate and separated by an isolation structure. The first gate structure is disposed on the substrate in the first active region, and the second gate structure is disposed on the substrate in the second active region. The first spacer structure is disposed on a sidewall of the first gate structure, and the second spacer structure is disposed on a sidewall of the second gate structure. Additionally, the first LDD is formed in the substrate at both sides of the first gate structure. The second LDD is formed in the substrate at both sides of the second gate structure. The first epitaxial material layer is disposed in the substrate in the first active region and located at a side of the first LDD to serve as a first conductive S/D region. The second epitaxial material layer is disposed in the substrate in the second active region and is located at a side of the second LDD to serve as a second conductive S/D region. The passivation layer is disposed on the second gate structure, the second spacer structure, and the second LDD, and covers the first active region, wherein the passivation layer is a carbon-containing oxynitride layer.

According to one embodiment of the present invention, the first conductive S/D region is a P-type S/D region and the second conductive S/D region is an N-type S/D region. The first epitaxial material layer is a SiGe layer and the second epitaxial material layer is a SiC layer.

According to one embodiment of the present invention, the first conductive S/D region is an N-type S/D region and the second conductive S/D region is a P-type S/D region. The first epitaxial material layer is a SiC layer and the second epitaxial material layer is a SiGe layer.

According to one embodiment of the present invention, the carbon-containing oxynitride layer is, for example, a BTBAS oxide layer.

Since the passivation layer in the present invention is a carbon-containing oxynitride layer with a low etching rate, the passivation layer can be avoided from being improperly removed during the device manufacturing process. Therefore, the generation of the poly bump and the various problems derived therefrom can be avoided. In addition, the thermal process of the present invention can densify the density of the passivation layer to decrease the etching rate of the passication layer. Hence, the thermal process is benefit to the later performed processes.

In order to the make aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
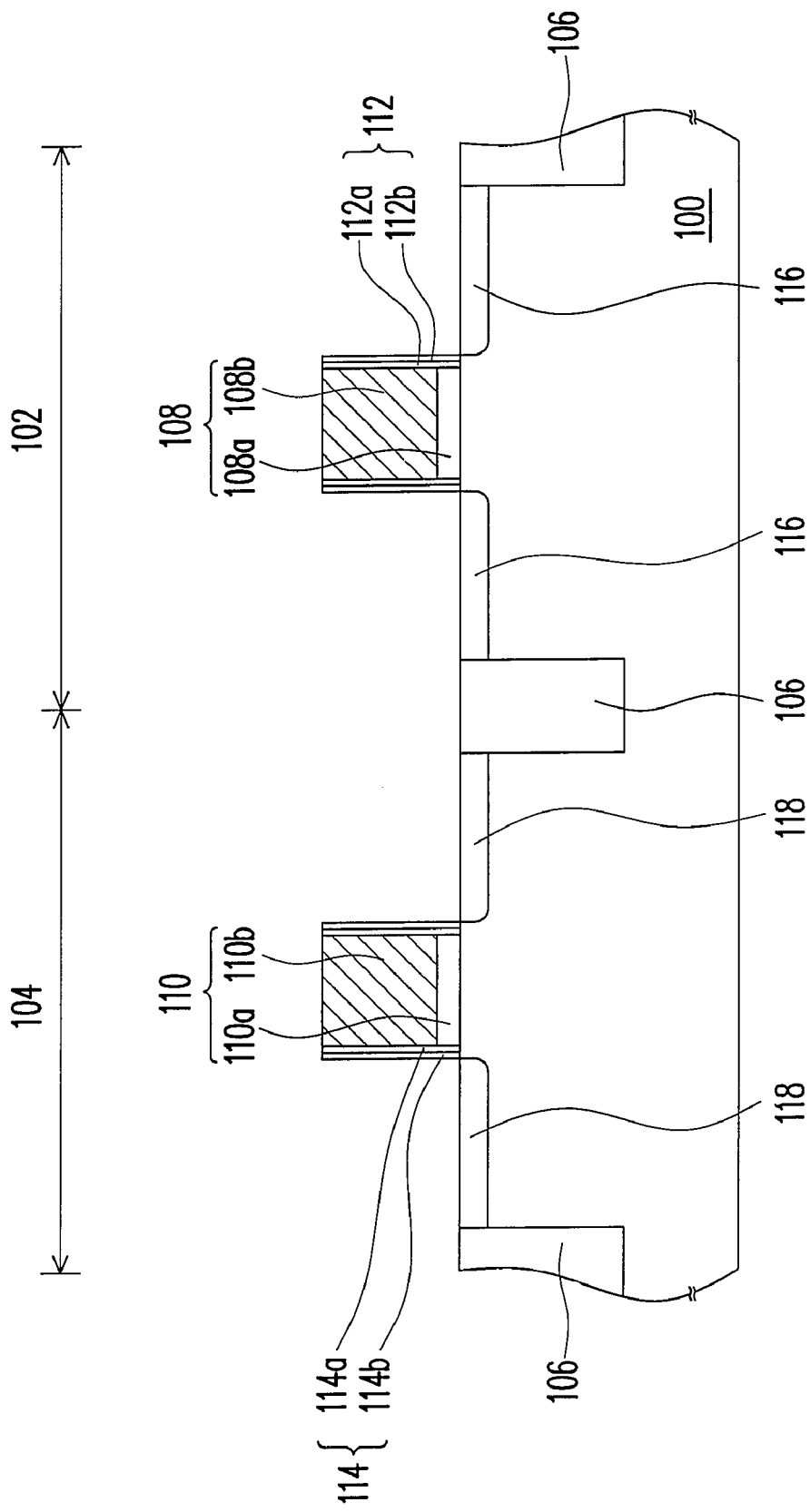
FIGS. 1A to 1H are schematic sectional views illustrating a method of fabricating a complementary metal-oxide-semiconductor device according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1H are schematic sectional views illustrating a method of fabricating a complementary metal-oxide-semiconductor device according to one embodiment of the present invention.

First, referring to FIG. 1A, a substrate 100 having a first active region 102 and a second active region 104 is provided, wherein the first active region 102 and the second active region 104 are separated by an isolation structure 106. The isolation structure 106 is, for example, a shallow trench isolation (STI) structure or any other suitable isolation structure. Next, a first gate structure 108 and a second gate structure 110 are formed on the first active region 102 and the second active region 104, respectively, wherein the first gate structure 108 has a gate dielectric layer 108a and a gate conductor layer 108b, and the second gate structure 110 has a gate dielectric layer 110a and a gate conductor layer 110b. The material and the method of fabricating the components of the first gate structure 108 and the second gate structure 110 are well-known to those skilled in the art and will not be described herein.

Next, referring to FIG. 1A, a first offset spacer 112 and a second offset spacer 114 are formed on the sidewalls of the first gate structure 108 and the second gate structure 110, respectively, wherein the first offset spacer 112 has an oxide layer 112a and a nitride layer 112b, and the second offset spacer 114 has an oxide layer 114a and a nitride layer 114b. The nitride layers 112b and 114b comprises, for example, silicon nitride, and the oxide layers 112a and 114a comprise, for example, a high-temperature oxide material. Subsequently, an implantation process is performed to form a first LDD 116 and a second LDD 118 in the substrate 100 at both sides of the first gate structure 108 and the second gate structure 110, respectively.

Figure 1B:
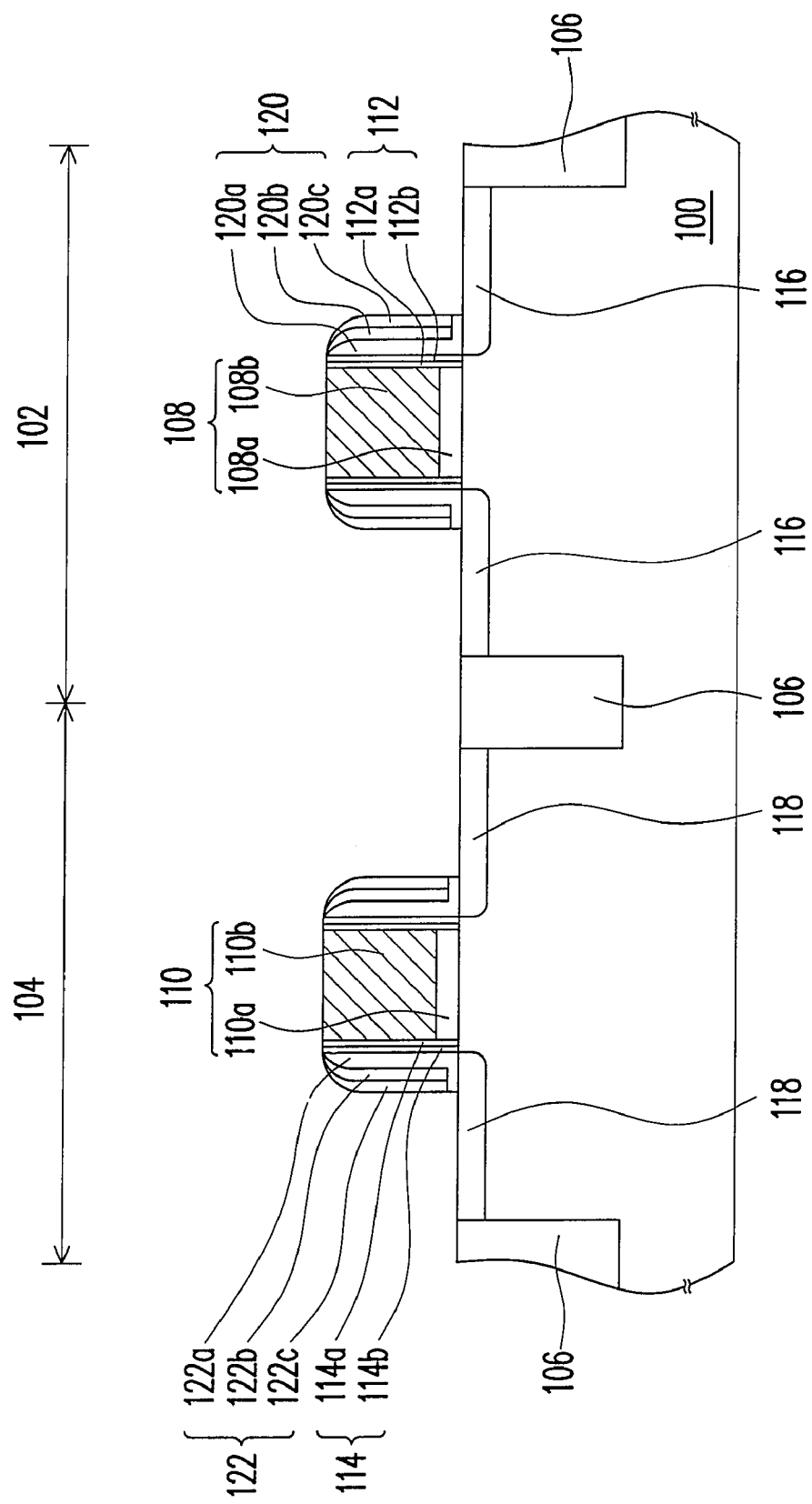

Next, referring to FIG. 1B, a first spacer 120 and a second spacer 122 are formed on sidewalls of the first offset spacer 112 and the second offset spacer 114, wherein the first spacer 120 has an oxide layer 120a, a nitride layer 120b, and an oxide layer 120c, and the second spacer 122 has an oxide layer 122a, a nitride layer 122b, and an oxide layer 122c. The nitride layers 120b and 122b comprise, for example, silicon nitride, and the oxide layers 120a, 120c, 122a, and 122c comprise, for example, a high-temperature oxide material.

Figure 1C:
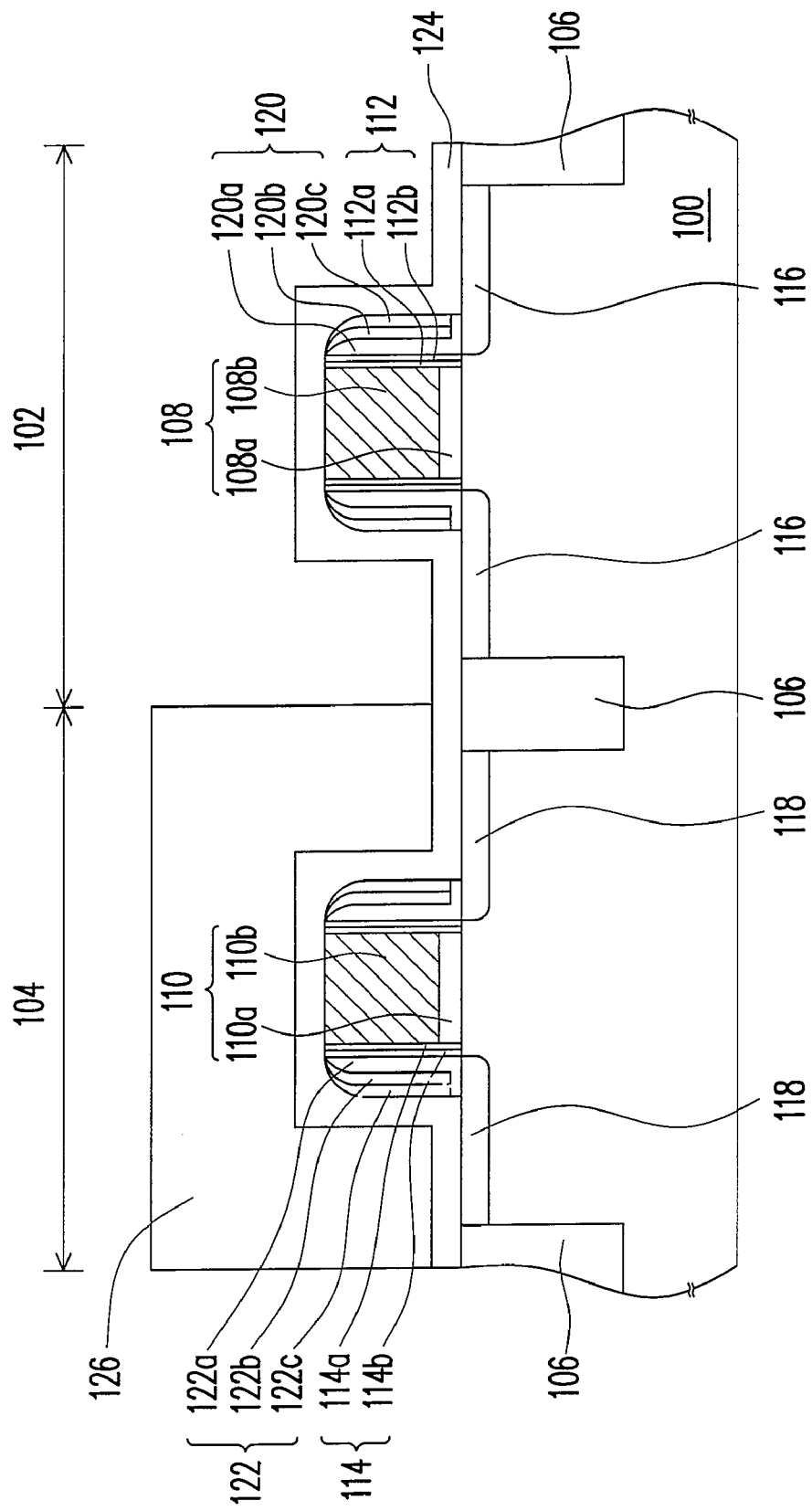

Next, referring to FIG. 1C, a passivation layer 124 is conformally formed on the substrate 100 to cover the first gate structure 108, the first offset spacer 112, the first spacer 120, the first LDD 116, the second gate structure 110, the second offset spacer 114, the second spacer 122, the second LDD 118, and the isolation structure 106. Next, a photoresist layer 126 is formed on the substrate 100 to cover the passivation layer 124 over the second active region 104.

The present invention is characterized in that the passivation layer 124 is a carbon-containing oxynitride layer with relatively low etching rate. The carbon-containing oxynitride layer comprises, for example, a bis(tert-butylamino)silane (BTBAS) oxide layer, namely BTBAS-based oxide layer. The method of forming the BTBAS-based oxide layer includes, for example, performing a low-pressure chemical vapor deposition (LPCVD) process, wherein the pressure is within a range of about 50-350 torr, the temperature is within a range of about 500-750° C., and the gas comprises BTBAS and $N_2O$ (or NO). BTBAS is a gas source of silicon and carbon of the carbon-containing oxynitride layer, while $N_2O$ (or NO) is used as a gas source of the nitride of the carbon-containing oxiynitride layer. In one embodiment, the relation of the flow ratio of BTBAS and $N_2O$ (or NO) is about larger than ½.

Subsequently, referring FIG. 1D, an anisotropic etching process is performed by using the photoresist layer 126 as a mask to remove a portion of the passivation layer 124 on the first gate structure 108, the first offset spacer 112, and the first spacer 120. Next, the photoresist layer 126 is removed.

It is worthy to note that the passivation layer 124 in the present invention is comprised of a carbon-containing oxynitride layer with a low etching rate. Therefore, when the photoresist layer 126 is removed, a portion of the passivation layer 124 of the second active region 104 remains so that the portion of the substrate surface is not exposed to leads to and therefore the possibility of problems various problems.

According to another embodiment of the present invention, the material of the oxide layers 112a and 114a of the first offset spacer 112 and the second offset spacer 114 comprise, for example, the same as that of the passivation layer 124, and may be formed by using, for example, the same process as that used for forming the passivation layer 124. The first and second offset spacers 112 and 114 may be formed using, for example, an in-situ deposition process.

According to another embodiment of the present invention, the material of the oxide layers 120a, 120c, 122a, and 122c of the first and second offset spacers 120 and 122 is, for example, the same as that of the passivation layer 124, and may be formed by using, for example, the same process used for forming the passivation layer. The method of forming the first and second spacers 120 and 122 includes, for example, an in-situ deposition process.

Subsequently, referring to FIG. 1E, a portion of the exposed substrate 100 in the first active region 102 is removed by using the passivation layer 124 as a mask to form a trench 128 in the substrate 100. The method for forming the trench 128 can be an etching process. Similarly, since the passivation layer 124 in the present invention is comprised of a carbon-containing oxynitride layer with a low etching rate, therefore the passivation layer 124 is not affected in thestep of forming the trench 128 in the substrate 100. That is, in the step for forming the trench 128, the portion of the passivation layer 124 on the top of the gate structure 108 is not removed to expose a portion of the surface of the gate structure 108.

Figure 1D:
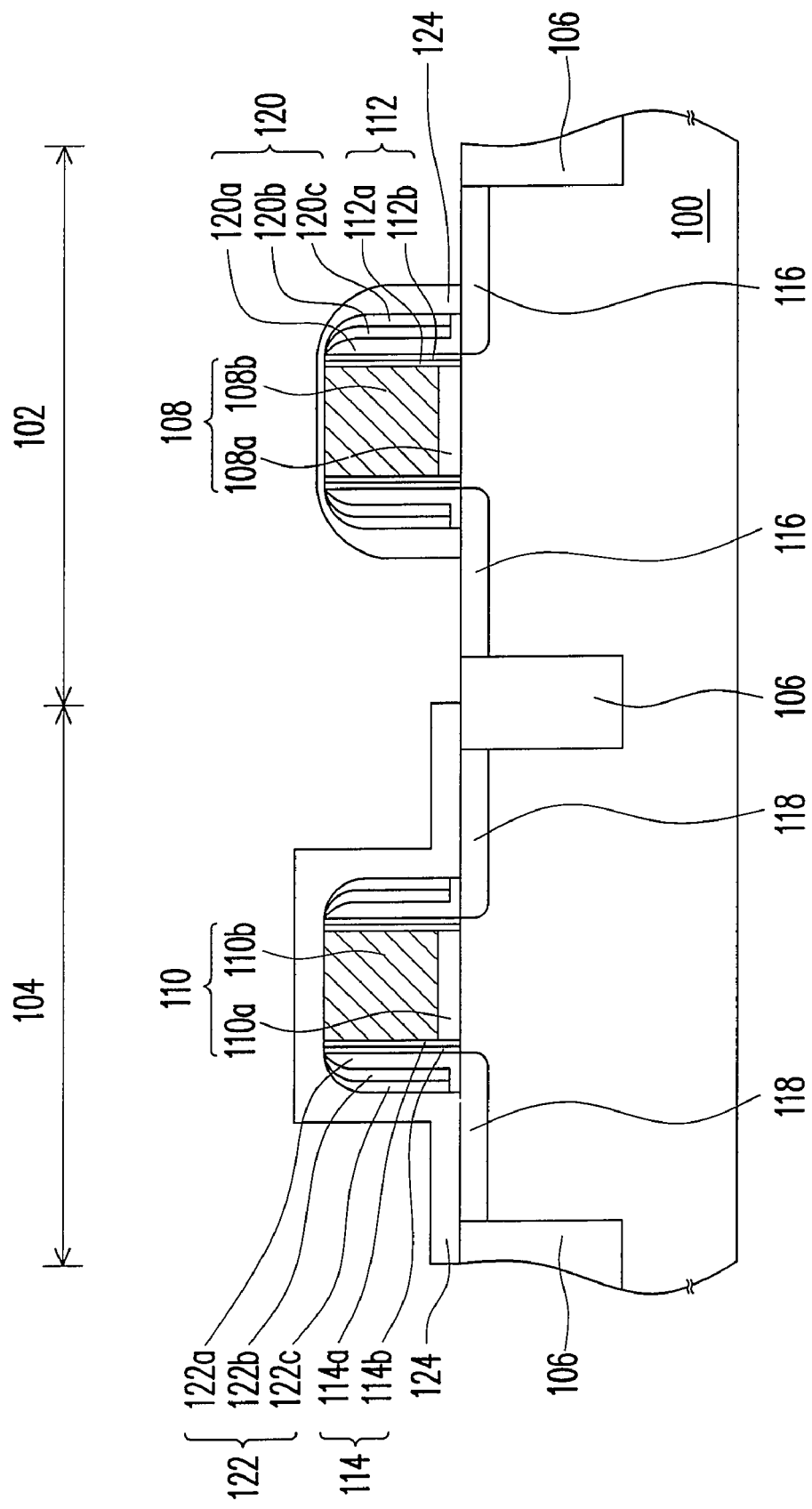
Figure 1E:
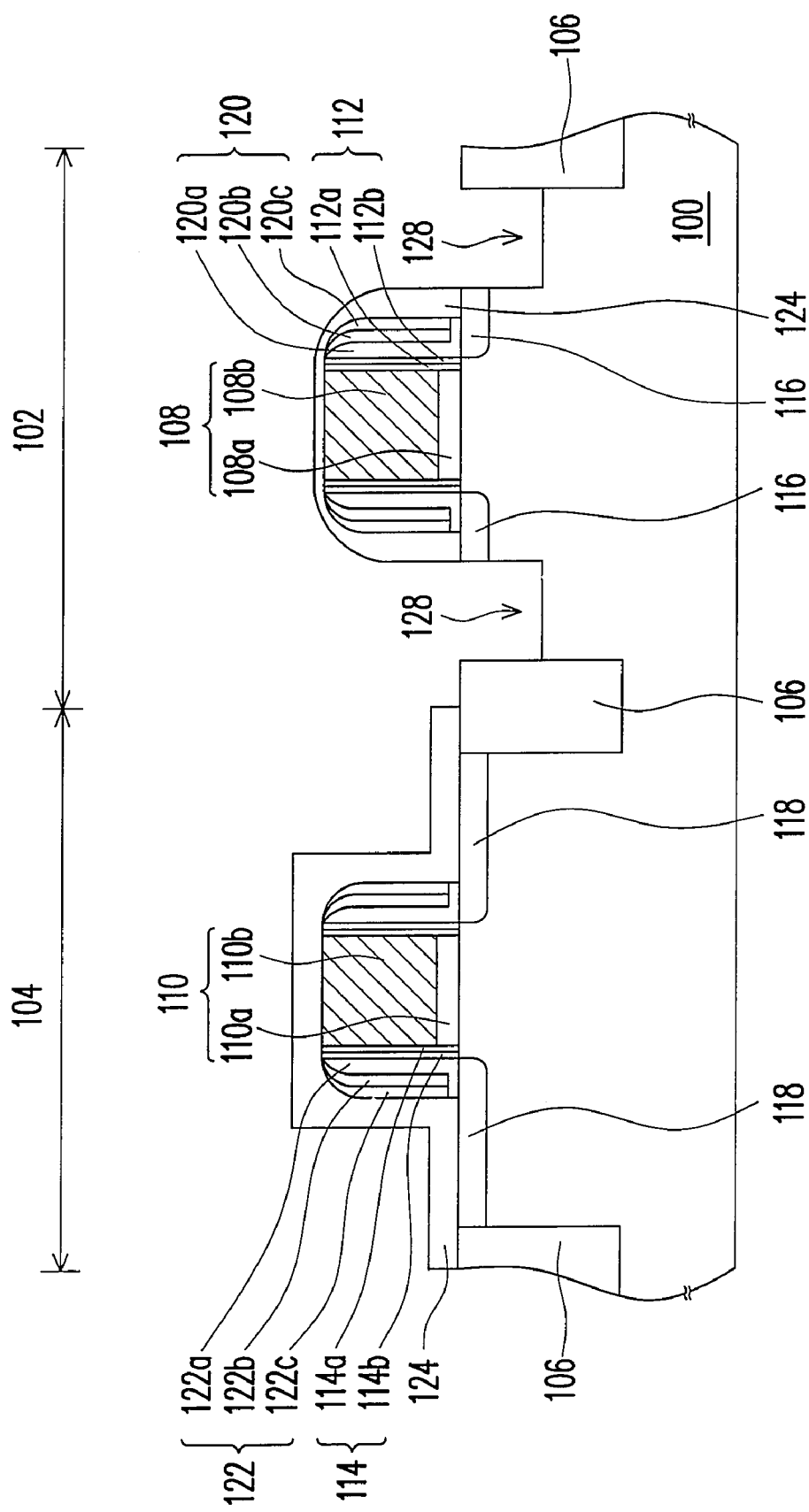
Figure 1F:
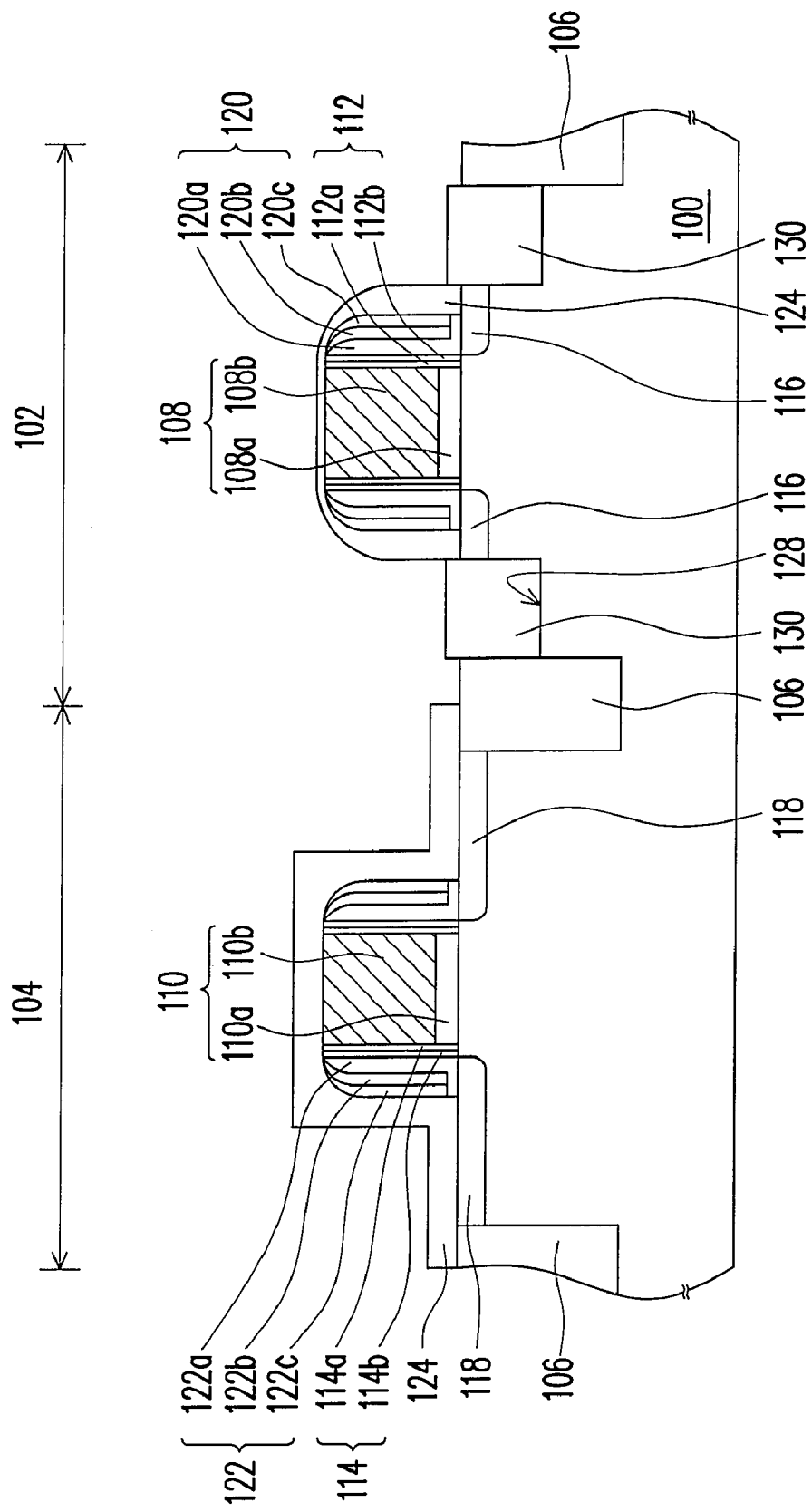

Next, referring to FIG. 1F, an epitaxial material layer 130 is filled in the trench 128 as a first conductive S/D region. In one embodiment, generally, before the epitaxial material layer 130 is filled, a clean process is performed to clean the surface of the substrate 100 in the bottom of the trench 128. Similarly, since the passivation layer 124 in the present invention can be a carbon-containing oxynitride layer with a low etching rate, the passivation layer 124 of the first active region 102 is not affected during the clean process. On the other words the portion of the passivation layer 124 of the first active region 102 is not removed to expose a portion of the surface of the gate structure 108.

Moreover, in the step for forming the epitaxial material layer 130, it further comprises a step of performing a pre-bake process to clean out the impurities generated during the formation of the trench 128.

In the aforementioned embodiments, if the first conductive S/D region is a P-type S/D region and the epitaxial material layer 130 is a SiGe layer, they may be formed by, for example, a selective epitaxial growth (SEG) process. More specifically, the epitaxial material layer 130 is a SiGe layer containing boron, and is formed through an in-situ doping process, or through an implantation process after the SiGe material layer is formed. On the other hand, if the first conductive S/D is an N-type S/D region, the epitaxial material layer 130 is a SiC layer.

The structure of the complementary metal-oxide-semiconductor device in one embodiment of the present invention is illustrated below. Referring to FIG. 1F, the device of the present invention comprises the substrate 100, the first gate structure 108, the second gate structure 110, the first offset spacer 112, the second offset spacer 114, the first LDD 116, the first spacer 120, the second LDD 118, the second spacer 122, the epitaxial material layer 130, and the passivation layer 124.

The substrate 100 comprises a first active region 102 and a second active region 104, wherein the first active region 102 and the second active region 104 are separated through an isolation structure 106. The first gate structure 108 is disposed on the first active region 102, and the second gate structure 110 is disposed on the second active region 104. Additionally, the first offset spacer 112 is disposed on a sidewall of the first gate structure 108, and the second offset spacer 114 is disposed on a sidewall of the second gate structure 110. The first offset spacer 112 has an oxide layer 112a and a nitride layer 112b, and the second offset spacer 114 has an oxide layer 114a and a nitride layer 114b. The oxide layer 112a and 114a of the first and second offset spacers 112 and 114 comprise, for example, a high-temperature oxide material or a carbon-containing oxynitride material.

The first LDD 116 is disposed in the substrate 100 at both sides of the first gate structure 108. The second LDD 118 is disposed in the substrate 100 at both sides of the second gate structure 110. Additionally, the first spacer 120 is disposed on a side wall of the first offset spacer 112, and the second spacer 122 is disposed on a side wall of the second offset spacer 114 and located on a part of the second LDD 118. The first spacer 120 has an oxide layer 120a, a nitride layer 120b, and an oxide layer 120c, and the second spacer 122 has an oxide layer 122a, a nitride layer 122b, and an oxide layer 122c. The oxide layers 120a, 120c, 122a, and 122c of the first and second spacers 120 and 122 comprise, for example, a high-temperature oxide material or a carbon-containing oxynitride material.

An epitaxial material layer 130 is disposed in the first active region 102 of the substrate 100 and located at one side of the first LDD to serve as a first conductive S/D region. The passivation layer 124 is disposed on the first gate structure 108, a first offset spacer 122, a first offset spacer 120, and the first LDD 116, and covers the whole second active region 104. The passivation layer 124 comprises a carbon-containing oxynitride layer, for example, a BTBAS oxide layer.

Since the passivation layer in the present invention can be a carbon-containing oxynitride layer having a low etching rate, the passivation layer can be protected from being improperly removed so that the generations of the conventional poly bump and various problems can be avoided.

Figure 1G:
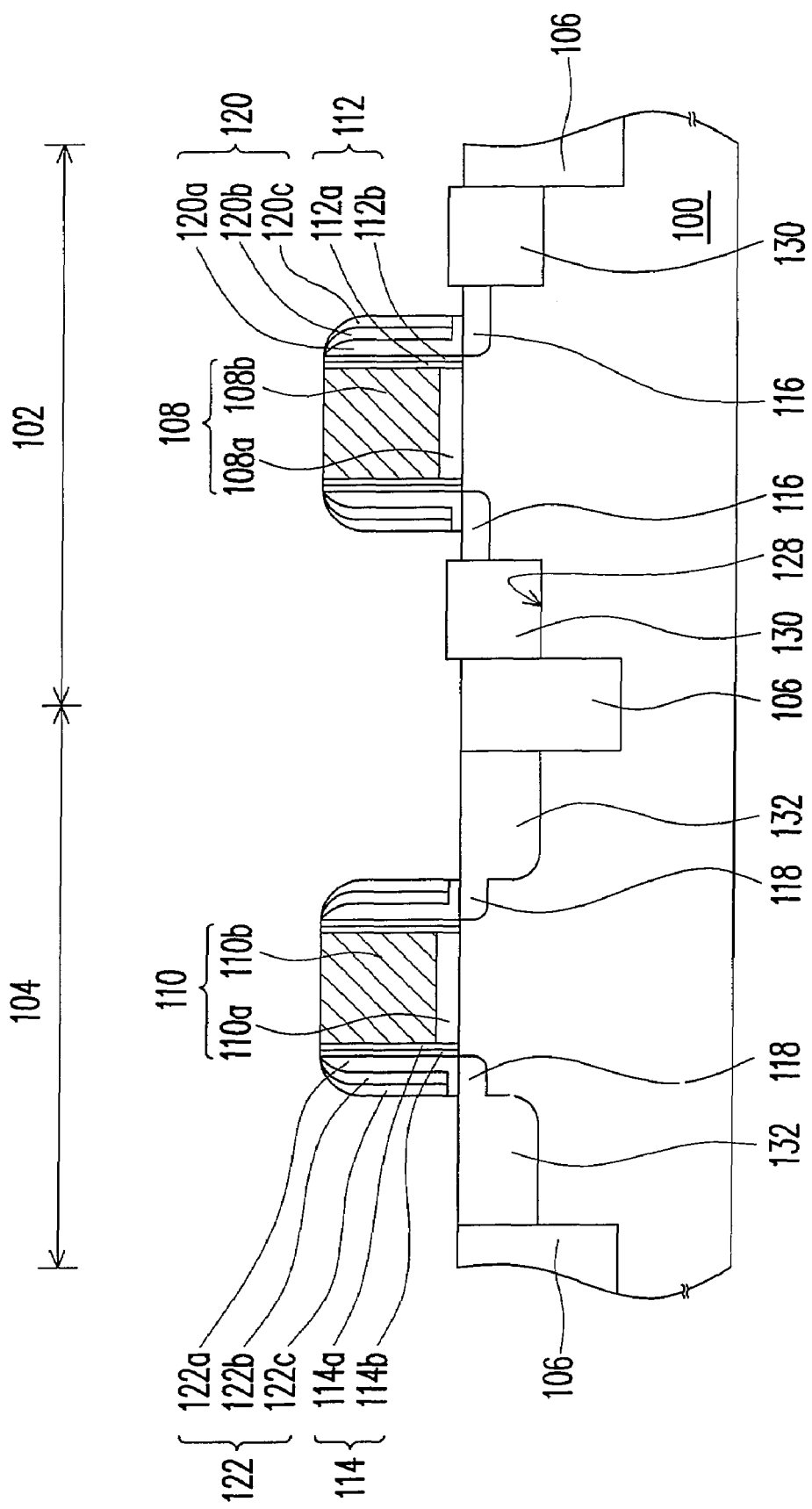

Next, referring to FIG. 1F, after the epitaxial material layer 130 is formed, the subsequent processes can be performed. Referring to FIG. 1G the passivation layer 124 is removed. Subsequently, an implantation process is performed to form a doped region 132 in the substrate 100 in the second active region 104 to serve as a second conductive S/D region.

Figure 1H:
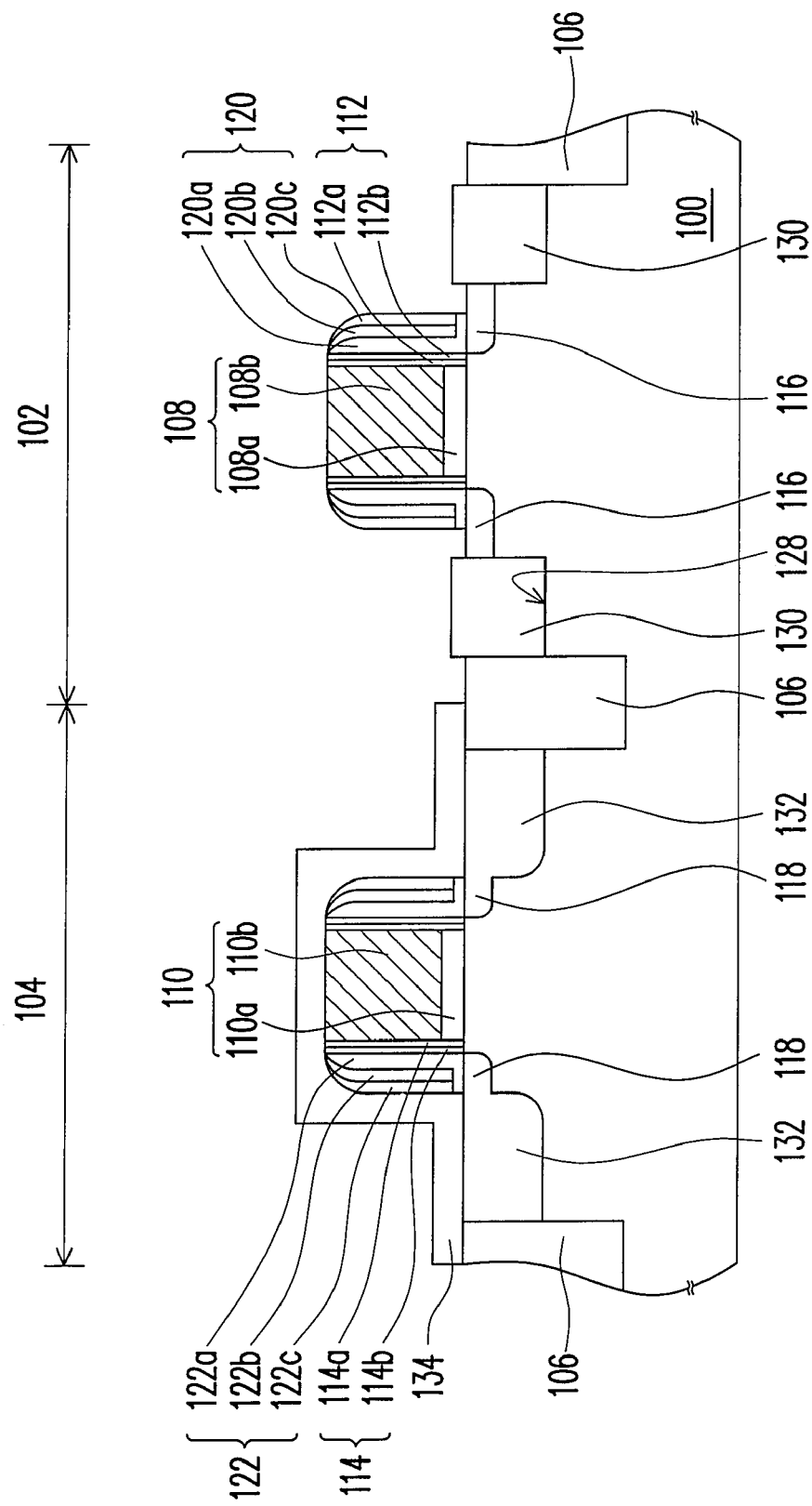

Next, referring to FIG. 1H, a stress layer 134 is conformally formed on the second active region 104 to cover the second gate structure 110, the second offset spacer 114, the second spacer 122, and the implantation region 132. The stress layer 134 comprises, for example, silicon nitride or any other suitable stress material, and may be formed by using, for example, chemical vapor deposition (CVD) or other suitable methods.

In the aforementioned embodiments, if the first conductive S/D region is a P-type S/D region and the epitaxial material layer 130 is a SiGe layer, the stress layer 134 is a tensile stress layer. On the other hand, if the first conductive S/D region is an N-type S/D region and the epitaxial material layer 130 is a SiC layer, the stress layer 134 is a compressive stress layer.

Besides, the present invention, after the step of forming the passivation layer 124 and before the step of performing a clean process onto the trench 128, further comprises a step of performing a thermal process to densify the density of the passivation layer 124. Therefore, the etching rate of the passivation layer 124 is decreased, which benefits the later performed processes. The aforementioned thermal process can be, for example but not limited to, performed at a temperature of about 750~800° C. and a pressure of about 5~50 torr for about 30 seconds to 10 minutes. Further, the gas used in the thermal process is selected from a group consisting of helium, neon, argon, krypton, xenon and nitrogen.

More clearly, the thermal process performed onto the passivation layer 124 contributes to avoiding the passivation layer 124 from being removed during the photoresist removing process, trench formation process and the clean process. Therefore, the generation of conventional poly bump can be avoided so that the performance of the device is not affected.

In one embodiment, by taking the first active region 102 being a P-type device region and the second active region 104 being an N-type device region as an exemplar, after the portion of the passivation layer 124 remains in the first active region 102 and the photoresist layer is removed (as shown in FIG. 1D), the aforementioned thermal process is performed. Therefore, not only the density of the passivation layer 124 is densified to decrease the etching rate of the passivation layer 124, but also the thermal process can contribute to the stress transfer scheme without degrading the performance of the device.

Figure 2A:
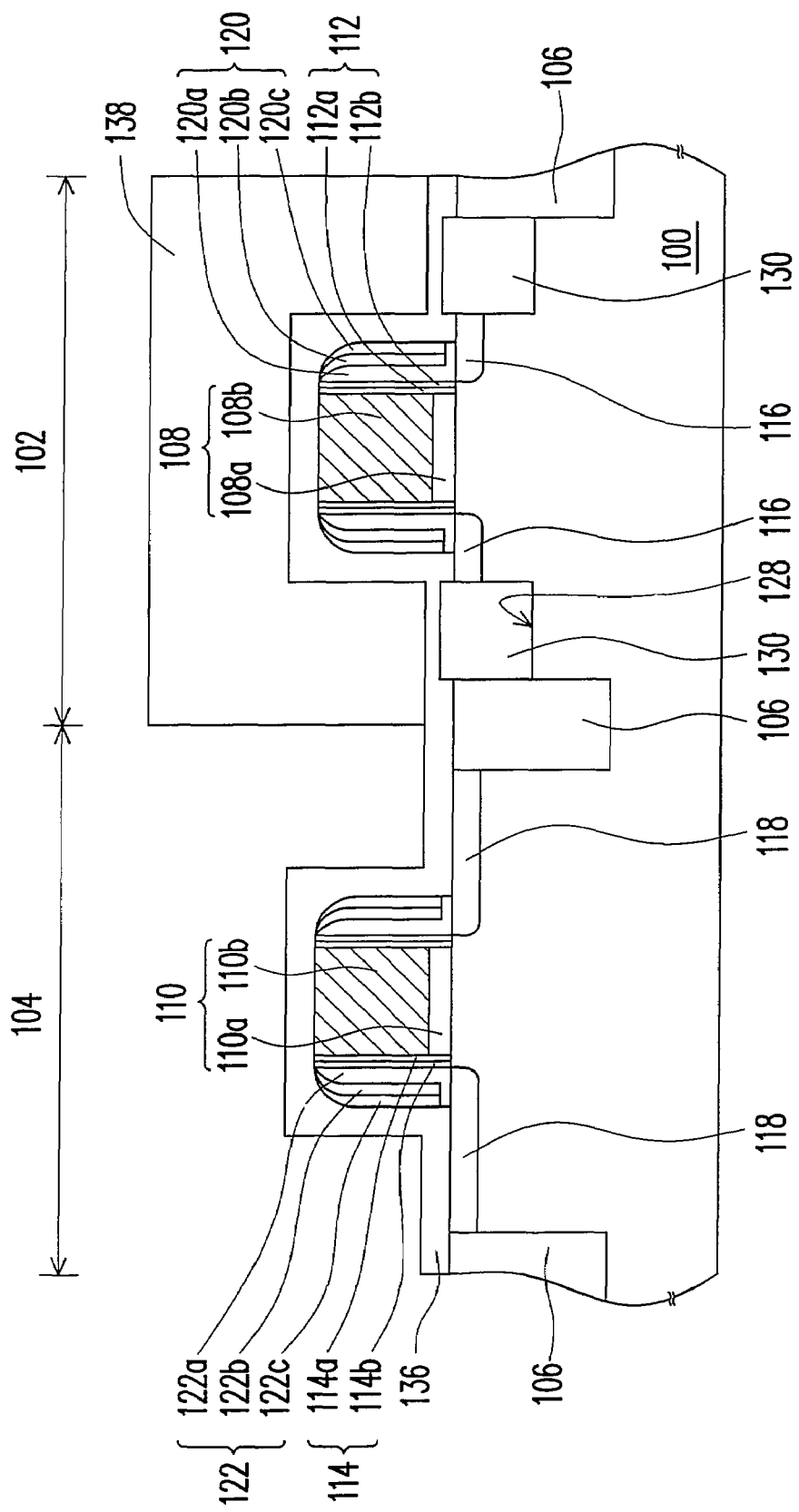
FIGS. 2A to 2D are schematic sectional views illustrating a method of fabricating a complementary metal-oxide-semiconductor device according to another embodiment of the present invention.
Figure 2B:
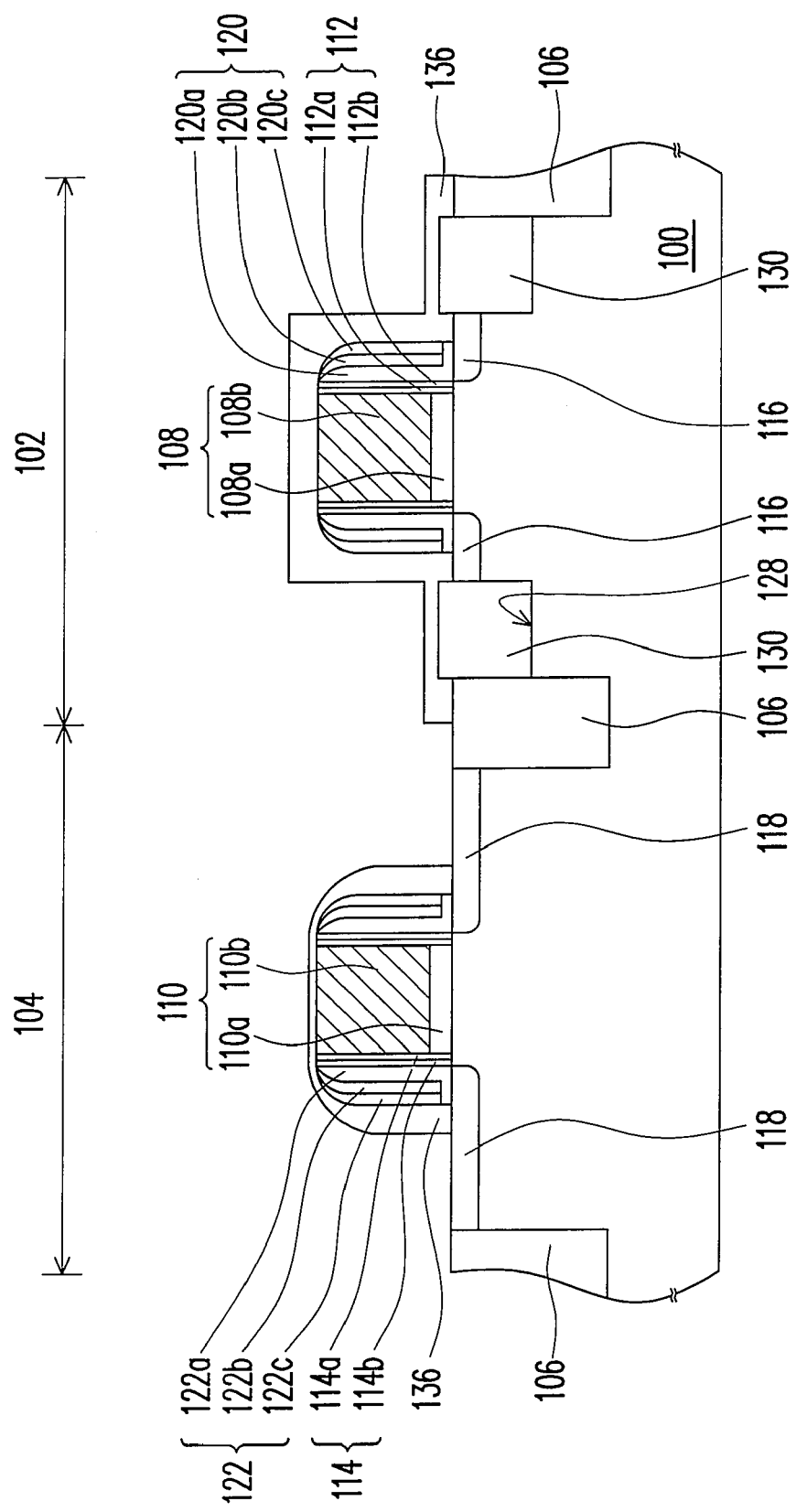
Figure 2C:
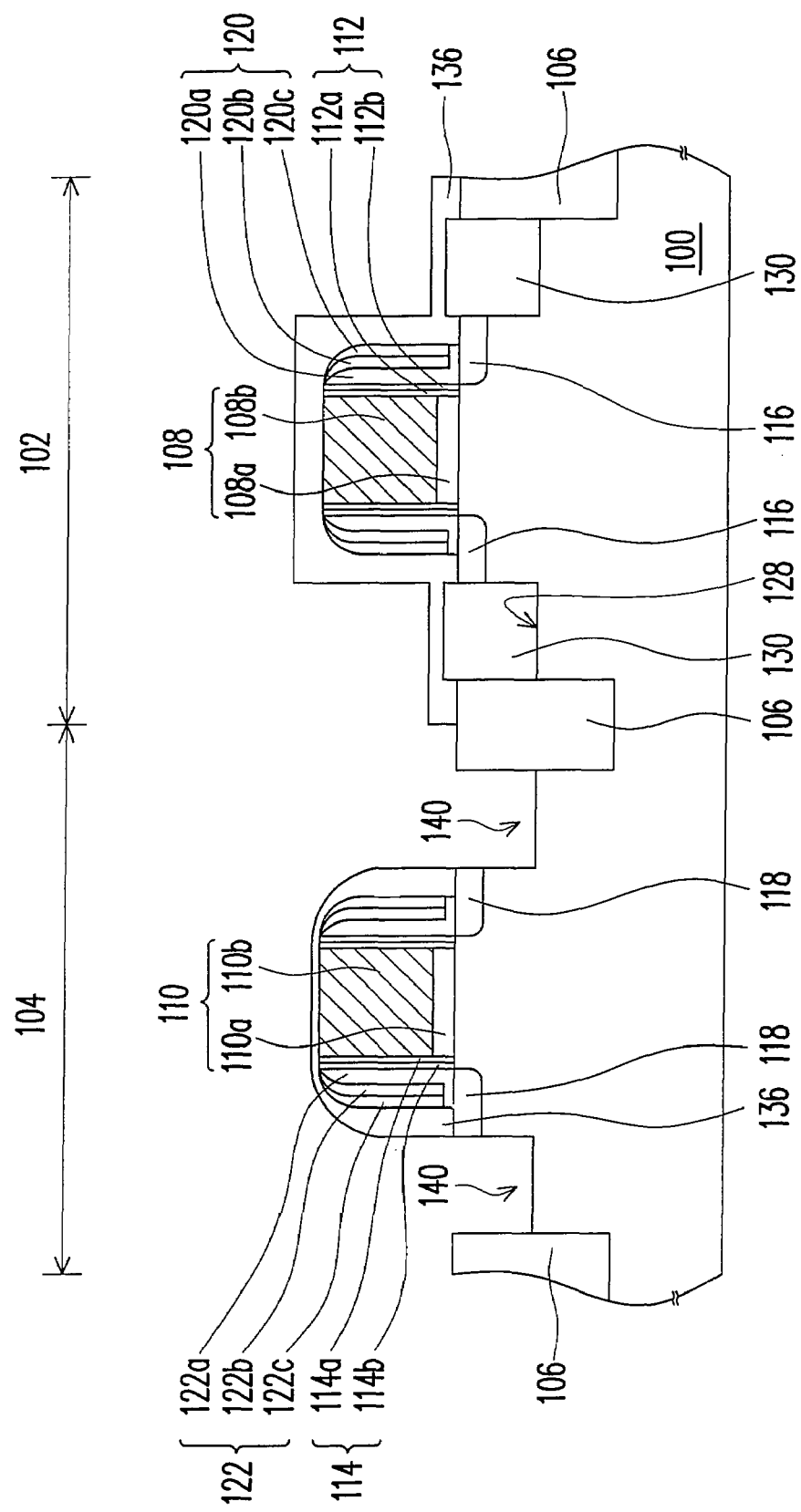

FIGS. 2A to 2D are schematic sectional views illustrating a method of fabricating a complementary metal-oxide-semiconductor device according to another embodiment of the present invention. FIGS. 2A to 2C are schematic sectional views illustrate process steps corresponding to those in FIG. 1A to 1F are therefore the detail description thereof are omitted.

Referring FIG. 2A, after the passivation layer 124 is removed, a passivation layer 136 is conformally formed on the substrate 100 to cover the first gate structure 108, the first offset spacer 112, the first spacer 120, the first LDD 116, the second gate structure 110, the second offset spacer 114, the second spacer 122, the second LDD 118, the isolation structure 106, and the epitaxial material layer 130. The passivation layer 136 may comprise the material as that of the passivation layer 124 and may be formed by the method as that of the passivation layer 124. Subsequently, a photoresist layer 138 is formed on the substrate 100 to cover the passivation layer 136 on the first active region 102.

Next, referring to FIG. 2B, an anisotropic etching process is performed by using the photoresist layer 138 as a mask to remove a portion of the passivation layer 136 on the second gate structure 110, the second offset spacer 114, and the second spacer 122. Next, the photoresist layer 138 is removed.

Next, referring to FIG. 2C, a portion of the exposed substrate 100 in the second active region 104 is removed by using the passivation layer as a mask to form a trench 140 in the substrate 100.

Figure 2D:
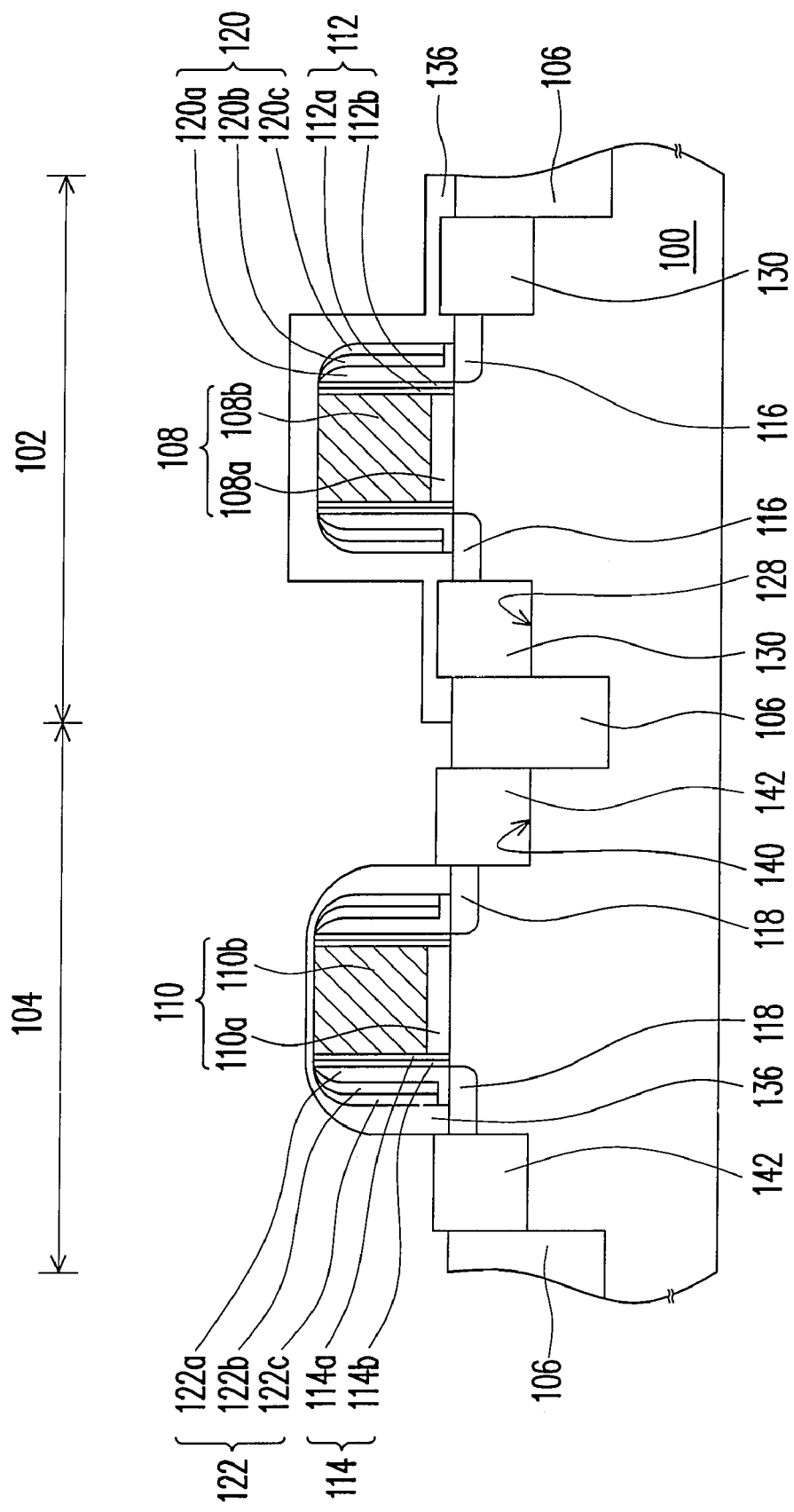

Subsequently, referring to FIG. 2D, an epitaxial material layer 142 is filled in the trench 140 to serve as a second conductive S/D region. In one embodiment, before the epitaxial material layer 142 is filled in, generally, a clean process is performed to clean the surface of the substrate 100 in the bottom of the trench 140.

In addition, in the step of forming the epitaxial material layer 142, it further comprises a step of performing a pre-bake process to clean out the impurities generated during the formation of the trench 140.

In the aforementioned embodiment, if the first conductive S/D region is a P-type S/D region and the second conductive S/D region is an N-type S/D region, the epitaxial material layer 130 is a SiGe layer and the epitaxial material layer 142 is a SiC layer. On the contrary, if the first conductive S/D region is an N-type S/D region and the second conductive S/D region is a P-type S/D region, the epitaxial material layer 130 is a SiC layer and the epitaxial material layer 142 is a SiGe layer.

Particularly, in the present invention, the material of the passivation layer 136 is the same as that of the passivation layer 124, which may be comprised of a carbon-containing oxynitride layer with a low etching rate. Therefore, the passivation layer 136 still remains in the first active region 136 during the processes of removing the photoresist layer 126 removing a portion of the substrate 100 to form the trench 128 and performing the clean process or the pre-bake process. Thus, the reliability and the performance of the device may be effectively promoted.

Similarly, the present invention, after the passivation layer 136 is formed and before the clean process is performed on the trench 140, further comprises a step of performing a thermal process to densify the density of the passivation layer 136. Therefore, the etching rate of the passivation layer 136 is decreased, which benefits the later performed processes. The aforementioned thermal process can be, for example but not limited to, performed at a temperature of about 750~800° C. and a pressure of about 5~50 torr for about 30 seconds to 10 minutes. Further, the gas used in the thermal process is selected from a group consisting of helium, neon, argon, krypton, xenon and nitrogen.

More clearly, the thermal process performed onto the passivation layer 136 contributes to avoiding the passivation layer 136 from being removed during the photoresist removing process, trench formation process and the clean process. Therefore, the generation of conventional poly bump can be avoided so that the performance of the device is not affected.

In one embodiment, by taking the first active region 102 being an N-type device region and the second active region 104 being a P-type device region as an exemplar, after the portion of the passivation layer 136 remains in the second active region 104 and the photoresist layer is removed (as shown in FIG. 2B), the aforementioned thermal process is performed. Accordingly, not only the density of the passivation layer 136 is densified to decrease the etching rate of the passivation layer 136, but also the thermal process can contribute to the stress transfer scheme without degrading the performance of the device.

Next, the structure of the complementary metal-oxide-semiconductor device in another embodiment of the present invention is illustrated below. Referring to FIG. 1F again, the device in the present invention comprises the substrate 100, the first gate structure 108, the second gate structure 110, the first offset spacer 112, the second offset spacer 114, the first LDD 116, the first spacer 120, the second LDD 118, the second spacer 122, the epitaxial material layer 130, the epitaxial material layer 142, and the passivation layer 136. The epitaxial material layer 142 is disposed on the second active region 104, and located at one side of the second LDD 118 to serve as a second conductive S/D region. The passivation layer 136 is disposed on the second gate structure 110, the second offset spacer 114, the second spacer 122, and the second LDD 118, and covers the whole first active region 102. The passivation layer 136 comprises a carbon-containing oxynitride layer, for example, a BTBAS oxide layer.

In view of the above, since the passivation layer in the present invention is comprised of a carbon-containing oxynitride layer with a low etching rate, the passivation layer may be protected from being improperly removed to form the poly bump as in the case of conventional art, and various problems derived there-from may be effectively reduced. Furthermore, a thermal process is performed on the passivation layer to densify the density of the passivation layer so as to decrease the etching rate of the passivation layer, which benefits to the subsequent processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a complementary metal-oxide-semiconductor device, comprising:

providing a substrate having an isolation structure dividing the substrate into a first active region and a second active region, wherein the first active region has a first gate structure, a first spacer structure and a first LDD formed therein and the second active region has a second gate structure, a second spacer structure and a second LDD formed therein;

forming a passivation layer conformally over the substrate, wherein the passivation layer comprises a carbon-containing oxynitride layer;

forming a photoresist layer on the passivation layer of the second active region;

performing an etching process by using the first photoresist layer as a mask to remain a portion of the first passivation layer completely covering the first gate structure and the first spacer structure removing the photoresist layer;

removing a portion of the exposed substrate in the first active region by using the passivation layer as a mask to form a trench in the substrate;

filling an epitaxial material layer in the trench to serve as a first conductive source/drain (S/D) region;

removing the passivation layer; and forming a doped region on the substrate in the second active region to serve as a second conductive S/D region.

2. The method of fabricating a complementary metal-oxide-semiconductor device as claimed in claim 1, wherein the carbon-containing oxynitride layer includes a bis(tert-butylamino)silane (BTBAS) oxide layer.

3. The method of fabricating a complementary metal-oxide-semiconductor device as claimed in claim 2, wherein the method for forming the bis(tert-butylamino)silane oxide layer comprises a low-pressure chemical-vapor deposition.

4. The method of fabricating a complementary metal-oxide-semiconductor device as claimed in claim 1, after the trench is formed, further comprises a step of performing a clean process.

5. The method of fabricating a complementary metal-oxide-semiconductor device as claimed in claim 4, before the clean process is performed and after the passivation layer is formed, further comprises a step of performing a thermal process on the passivation layer.

6. The method of fabricating a complementary metal-oxide-semiconductor device as claimed in claim 5, wherein the thermal process is performed at a temperature of about 750~800° C.

7. The method of fabricating a complementary metal-oxide-semiconductor device as claimed in claim 5, wherein the thermal process is performed for about 30 seconds to 10 minutes.

8. The method of fabricating a complementary metal-oxide-semiconductor device as claimed in claim 5, wherein the thermal process is performed at a pressure of about 5~50 torr.

9. The method of fabricating a complementary metal-oxide-semiconductor device as claimed in claim 5, wherein a gas used in the thermal process is selected from a group consisting of helium, neon, argon, krypton, xenon and nitrogen.

10. The method of fabricating a complementary metal-oxide-semiconductor device as claimed in claim 1, after the doped region is formed, further comprising:

forming a stress layer in the second active region over the substrate, wherein the stress layer conformally covers the second gate structure, the second spacer structure and the doped region.

11. The method of fabricating a complementary metal-oxide-semiconductor device as claimed in claim 10, wherein the first conductive S/D region is a P-type S/D region and the epitaxial material layer is a SiGe layer and the stress layer is a tensile stress layer.

12. The method of fabricating a complementary metal-oxide-semiconductor device as claimed in claim 10, wherein the first conductive S/D region is an N-type S/D region and the epitaxial material layer is a SiC layer and the stress layer is a compressive stress layer.

13. A method of fabricating a complementary metal-oxide-semiconductor device, comprising:

providing a substrate having an isolation structure dividing the substrate into a first active region and a second active region, wherein the first active region has a first gate structure, a first spacer structure and a first LDD formed therein and the second active region has a second gate structure, a second spacer structure and a second LDD formed therein;

forming a first passivation layer to conformally cover the substrate, wherein the first passivation layer is a carbon-containing oxynitride layer;

forming a first photoresist layer on the substrate to cover the first passivation layer on the second active region;

performing an etching process by using the photoresist layer as a mask to remain a portion of the first passivation layer completely covering the first gate structure and the first spacer structure, removing the first photoresist layer;

removing a part of the exposed substrate in the first active region by using the first passivation layer as a mask to form a first trench in the substrate;

filling a first epitaxial material layer in the first trench to serve as a first conductive S/D region;

removing the first passivation layer;

forming a second passivation layer to conformally cover the substrate, wherein the second passivation layer is a carbon-containing oxynitride layer;

forming a second photoresist layer on the substrate to cover the second passivation layer on the first active region;

performing an etching process by using the second photoresist layer as a mask to remain a portion of the second passivation layer completely covering the second gate structure and the second spacer structure removing the second photoresist layer;

removing a portion of the exposed substrate in the second active region by using the second passivation layer as a mask to form a second trench in the substrate; and filling a second epitaxial material layer in the first trench to serve as a second conductive S/D region.

14. The method of fabricating a complementary metal-oxide-semiconductor device as claimed in claim 13, wherein the carbon-containing oxynitride layer includes a bis(tert-butylamino)silane (BTBAS) oxide layer.

15. The method of fabricating, a complementary metal-oxide-semiconductor device as claimed in claim 14, wherein the method for forming the bis(tert-butylamino)silane oxide layer comprises a low-pressure chemical-vapor deposition.

16. The method of fabricating a complementary metal-oxide-semiconductor device as claimed in claim 13, after the first trench is formed and/or the second trench is formed, further comprises a step of performing a clean process.

17. The method of fabricating a complementary metal-oxide-semiconductor device as claimed in claim 16, before the clean process is performed and after the first passivation layer and the second passivation layer are formed, further comprises a step of performing a thermal process on the first passivation layer and the second passivation layer.

18. The method of fabricating a complementary metal-oxide-semiconductor device as claimed in claim 17, wherein the thermal process is performed at a temperature of about 750~800° C.

19. The method of fabricating a complementary metal-oxide-semiconductor device as claimed in claim 17, wherein the thermal process is performed for about 30 seconds to 10 minutes.

20. The method of fabricating a complementary metal-oxide-semiconductor device as claimed in claim 17, wherein the thermal process is performed at a pressure of about 5~50 torr.

21. The method of fabricating a complementary metal-oxide-semiconductor device as claimed in claim 17, wherein a gas used in the thermal process is selected from a group consisting of helium, neon, argon, krypton, xenon and nitrogen.

22. The method of fabricating a complementary metal-oxide-semiconductor device as claimed in claim 13, wherein the first conductive S/D region is a P-type S/D region, the second conductive S/D region is an N-type S/D region, the first epitaxial material layer is a SiGe layer, and the second epitaxial material layer is a SiC layer.

23. The method of fabricating a complementary metal-oxide-semiconductor device as claimed in claim 13, wherein the first conductive S/D region is an N-type S/D region, the second conductive S/D region is a P-type S/D region, the first epitaxial material layer is a SiC layer, and the second epitaxial material layer is a SiGe layer.

\* \* \* \* \*